United States Patent
Jensen

(10) Patent No.: US 7,184,235 B2
(45) Date of Patent: Feb. 27, 2007

(54) POWER MANAGEMENT IN OPERATING RECORDING MEDIA

(75) Inventor: Peter Jensen, Fremont, CA (US)

(73) Assignee: TEAC Aerospace Technologies, Inc., Montebello, CA (US)

( * ) Notice: Subject to any disclaimer, the term of this patent is extended or adjusted under 35 U.S.C. 154(b) by 0 days.

(21) Appl. No.: 10/905,711

(22) Filed: Jan. 18, 2005

(65) Prior Publication Data

US 2006/0158765 A1    Jul. 20, 2006

(51) Int. Cl.
*G11B 5/02* (2006.01)
(52) U.S. Cl. .................................................. 360/55
(58) Field of Classification Search ............... None
See application file for complete search history.

(56) References Cited

U.S. PATENT DOCUMENTS

| | | | |
|---|---|---|---|
| 3,599,186 A | 8/1971 | May et al. | |
| 5,065,364 A | 11/1991 | Atwood et al. | |
| 5,412,809 A * | 5/1995 | Tam et al. | 713/324 |
| 5,530,828 A | 6/1996 | Kaki et al. | |
| 5,787,493 A | 7/1998 | Niijima et al. | |
| 5,841,721 A | 11/1998 | Kwon et al. | |
| 5,854,720 A * | 12/1998 | Shrinkle et al. | 360/69 |
| 6,014,279 A | 1/2000 | Yamagata | |
| 6,047,352 A | 4/2000 | Lakhani et al. | |
| 6,507,885 B2 | 1/2003 | Lakhani et al. | |
| 6,731,447 B2 | 5/2004 | Bunker et al. | |
| 6,744,578 B1 | 6/2004 | Bishop | |
| 6,930,853 B2 * | 8/2005 | Settje et al. | 360/78.04 |
| 2002/0141094 A1 * | 10/2002 | Suzuki et al. | 360/68 |
| 2002/0196572 A1 | 12/2002 | Bress et al. | |
| 2003/0210489 A1 | 11/2003 | Hirakata et al. | |

* cited by examiner

*Primary Examiner*—Hoa T. Nguyen
*Assistant Examiner*—Mitchell Slavitt
(74) *Attorney, Agent, or Firm*—Greenberg Traurig LLP

(57) ABSTRACT

A method of managing power used by a recording medium is disclosed. The recording medium receives a maximum current value and limits its operation to consume up to the maximum current value during a given storage operation. The recording medium may comprise a storage module coupled to a controller. The controller in the recording medium may receive the maximum current value and limit the operation of the recording medium to the maximum current value.

32 Claims, 5 Drawing Sheets

| Field | Bit 7 | Bit 6 | Bit 5 | Bit 4 | Bit 3 | Bit 2 | Bit 1 | Bit 0 |
|---|---|---|---|---|---|---|---|---|
| Command (7) | Limit Current Command ||||||||
| Drive/Head (6) | X | X | X | Drive ||| Head Number ||
| Feature (1) | Maximum Amount of Current ||||||||

200

210 — Command (7)
220 — Drive/Head (6)
230 — Feature (1)

FIG. 2

POWER MANAGEMENT IN OPERATING RECORDING MEDIA

FIELD OF THE DISCLOSURE

This disclosure relates to the management of power used by recording media. In particular, the disclosure relates to the regulation of power usage during operations performed by a recording medium.

GENERAL BACKGROUND

Recording media are required to continuously perform basic functions such as read and write. Examples of recording media include optical, magnetic (e.g. hard drives) and solid-state recording media (e.g. flash memory, ROM, PROM).

Read and write operations, along with other even more complex operations, may differ substantially in the electric power consumption needs placed on a recording medium. Customarily, the controller used to operate a recording medium (sometimes referred to herein as a "recording medium controller") does not accept or store information regarding the power supply. Rather, in executing an operation, the controller blindly uses all available power in order to make the operation more time efficient and prompt. As such, the recording medium does not always draw a constant amount of current. Instead, the current drawn can vary from a near-zero value when the medium is inactive, to a maximum consumption when active.

If the operation uses power unrestrainedly, an excess of power can produce unwanted results such as unintentionally destroying data recorded in the recording medium or destroying the circuitry in the recording medium. The excess of power supply resulting from such uncontrolled power usage can also hinder the successful execution of operations on a recording medium.

SUMMARY

In one aspect, there is a method of managing power used by a recording medium by receiving a maximum current value in the recording medium and limiting operation of the recording medium to the maximum current value during a storage operation (e.g. read, write). This can be achieved by limiting the current drawn by the recording medium to a value no greater than the maximum current value. The recording medium also includes a storage module and a controller coupled to control the storage module. The storage module may be a non-volatile storage module. The recording medium may be a solid-state PROM memory device, a solid-state flash memory device, a magnetic tape storage system, or a hard disk drive. In yet another aspect, if the maximum current value received is zero, the current consumption of the recording medium during operation is limited to a default value.

In another aspect, the maximum current value is received by the controller from a processor in a computing device. The recording medium may be operable to implement storage operations requested by a processor. The processor, in turn, may be coupled to provide commands to the controller corresponding to the type of storage operation to be performed by the recording medium. Upon setting the maximum current value, the controller may transmit to the processor a signal indicative of a status of the maximum current value. In another aspect, the recording medium has more than one storage module. The controller may receive a drive identifier which is used to identify each storage module.

In another aspect, the storage operation may be performed in a plurality of memory blocks. The recording medium may consume at most the maximum current value when performing the storage operation on the plurality of memory blocks. In yet another aspect, the storage operation is limited in power usage by calculating a maximum number of memory blocks to operate simultaneously. This number is determined by dividing the maximum current value into a current value used by one memory block.

In one aspect, there is a power management system for a recording medium including a computing device coupled to the recording medium by a communication bus. The computing device comprises a processor operable to transmit a maximum current value to the recording medium. The recording medium comprises a controller coupled to receive the maximum current value from the computing device, and to store data in a storage module. The controller limits the current consumption of the recording medium during a storage operation to a level no greater than the maximum current value. The maximum current value may be stored in a register in the controller.

In another aspect, there is a method of managing power consumption by a recording medium by receiving a maximum power value by a recording medium and controlling operation of the recording medium to limit power consumption by the recording medium to a value no greater than the maximum power value. The operation of the recording medium may entail limiting power consumption during a plurality of storage operations (e.g. two erase operations). The maximum power value may be received by a controller coupled to control the operation of the recording medium.

In another aspect, the storage operation is an erase operation performed on a recording medium which includes a plurality of memory blocks. The controlling operation of the recording medium entails limiting the number of the plurality of memory blocks erased during the erase operation.

In yet another aspect, the recording medium may receive a command to perform a storage operation (e.g. read, write, etc.) along with a maximum power value. The recording medium is then controlled as to limit power consumption during the storage operation corresponding to the command.

In another aspect, a second command may be received by the recording medium to perform a second storage operation, wherein the second command includes a second maximum power value. The recording medium is controlled to limit power consumption by the recording medium to a value no greater than the second maximum power value during the second storage operation.

In one aspect, there is a method for limiting power consumption by a recording medium divided in memory blocks. A value corresponding to a quantity of current used by the recording medium when performing a storage operation for one block is defined. Then, a maximum current limit for operation of the recording medium is defined. Further, a maximum number of the plurality of memory blocks to operate upon during a single storage operation is determined. Such determination is made based on the value corresponding to the quantity of current used by the recording medium for one block, and the maximum current limit. The recording medium is then limited to operate so that no more than the maximum number of the plurality of memory blocks is operated upon during a single storage operation.

BRIEF DESCRIPTION OF THE DRAWINGS

By way of example, reference will now be made to the accompanying drawings.

FIG. 2 illustrates a tabular diagram of the content of a power management message sent to a hard disk drive in one embodiment.

DETAILED DESCRIPTION

The method and system described below provide an improved way to limit the amount of power used by a recording medium when storing or otherwise operating on data. In one approach, a controller used to operate the recording medium receives a maximum current amount and then controls operation of the recording medium so that its power consumption does not exceed the specified amount of current. When performing any of a variety of possible storage operations that may be implemented by the recording medium, the amount of power drawn by the recording medium from a power source will be limited by the controller to the received maximum current amount. A typical benefit is that damage to the recording medium such as, for example, overheating is prevented.

A common storage operation is an erase operation. During an erase operation when erasing data from the recording medium, it is common that multiple areas or blocks may be erased simultaneously. The number of blocks of data to erase may be sufficiently large enough that, if no limit has been placed on the current amount to be used by the recording medium, the amount of current that the controller permits the recording medium to consume may exceed the amount of current that the recording medium can safely handle. As a result, an attempt to erase data from the recording medium for a large number of blocks may result in the physical destruction of the medium.

The method and system of this disclosure provide the ability to manage power consumption in relation to the amount of power needed by the recording medium depending on the operation performed. Further, the amount of power consumed may be changed during the operation of the recording medium. The consumption of power can be limited in order to prevent power oversupply, to save energy, etc. The disclosed power management method and system can be applied to multiple types of recording media including optical, magnetic and solid-state recording media.

Figure 1A:
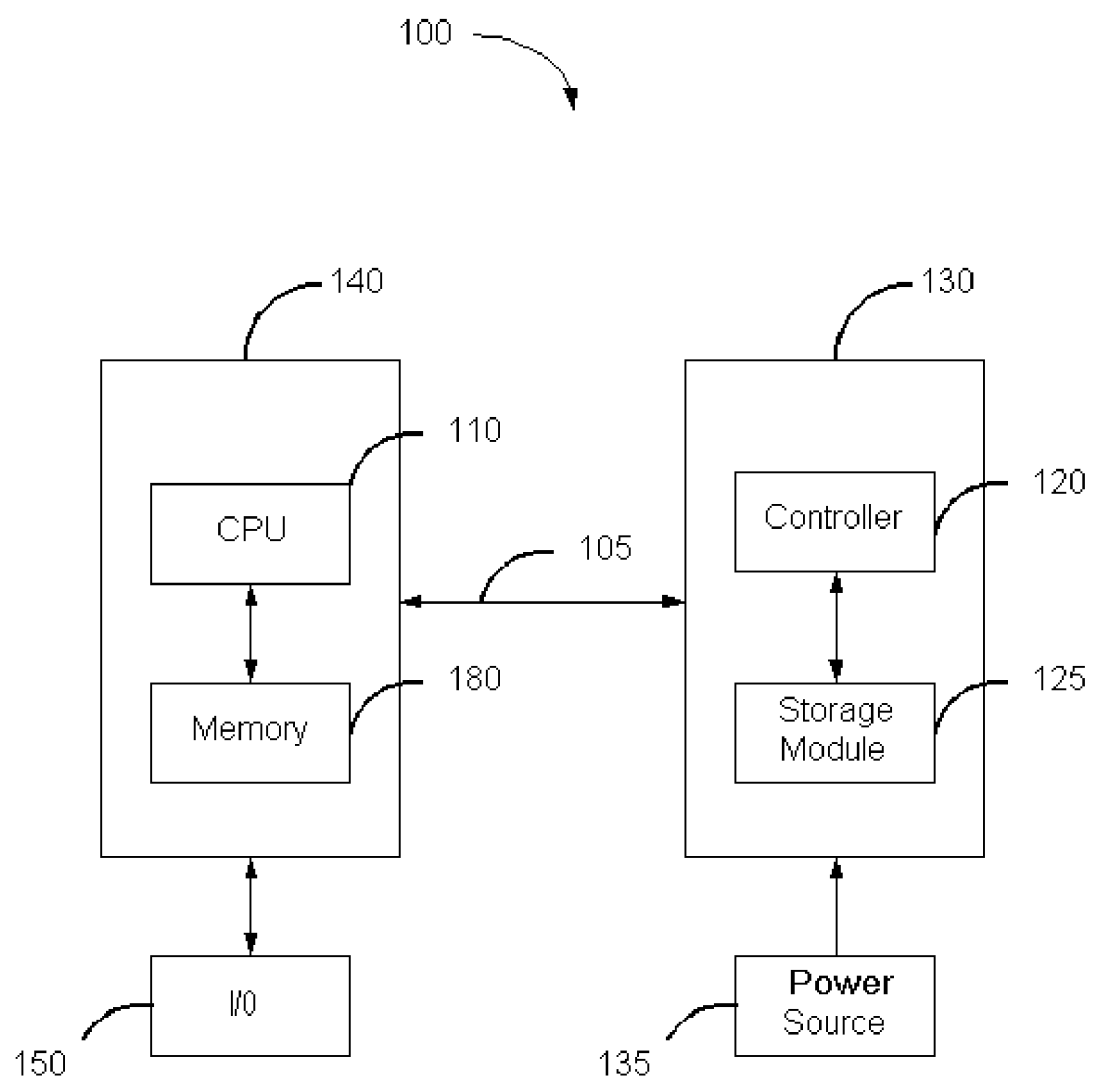
FIG. 1A illustrates a computing system coupled to a recording medium.

FIG. 1A illustrates a system 100 for managing power in a recording medium 130 according to a first embodiment. The recording medium 130 includes a controller 120 and a storage module 125. The controller 120 may be a computer processor that operates the storage module 125 by, for example, directing the reading and writing of data on the storage module 125. The recording medium 130 draws electrical power from a power source 135 as needed to perform its operations, but within a maximum current limit as controlled by controller 120. In one embodiment, the controller 120 may store the maximum current limit in the storage module 125. Depending on the type of recording medium 130 used (e.g. hard drive, flash memory, magnetic tape), the hardware controller 120 used for the storage module 125 will vary. For example, if the recording medium 130 is a hard drive, the controller 120 may be a hard disk drive controller and the storage module 125 may be a hard disk. If the recording medium 130 is a flash memory, the controller 120 may be a flash memory controller and the storage module 125 may be one or more flash memory chips.

The recording medium 130 communicates with other devices such as a computing device 140 through an interface 105. The interface 105 serves as a connection to pass data back and forth from the recording medium 130 to the computing device 140. The interface 105 may be, for instance, a data bus or a communication bus. The computing device 140 may include a processor or CPU 110 and a memory 180 (e.g. RAM). The CPU 110 manages the memory 180. The computing device 140 may receive user input through an input/output device 150. The input/output device 150 may be, for example, a keyboard, mouse, touchpad, joystick, touch-screen, voice recognition system, etc. The input/output device 150 allows a user to interface with the computing device 140. The user may be, for example, any person with privileges to perform storage operations on the storage module 125. The computing device 140 may be a personal computer, a laptop, a cellular phone, a personal data assistant, a media player, a media recorder, a server, a digital video recorder, an embedded control system in a media recorder, an embedded control system in a digital video recorder, an embedded control system in any other electrical device, etc.

The CPU 110 may communicate with the controller 120 by receiving and transmitting various commands in relation to the data to be stored in the storage module 125. One such message may be a power management message sent to the controller 120 and may include, in one approach, a set-current command, a drive identifier and the maximum current limit.

The maximum current limit may be determined in various ways. In some embodiments, the user may enter into the computing device 140 a specific current value to be used as the limit by the storage module 125. The computing device 140 receives the limit entered by the user through the input/output device 150.

In another embodiment, the CPU 110 generates the amount of current based on calculations made by a specific application running on the CPU 110 that needs to or desirably prefers to limit the consumption of power by recording medium 130. For example, a computer program running on the CPU 110 may be configured to set a predefined maximum current limit amount every time the recording medium 130 restarts. Once the maximum current limit is known, a power management message may be constructed by a process running on the CPU 110.

The power management message may also optionally include a set-current command, which may be an instruction recognized by the controller 120. The power management message may further optionally include a drive identifier. In some embodiments, where there is a plurality of storage modules managed by the controller 120, the drive identifier allows the controller 120 to determine the storage module that will have imposed a maximum current limit. The storage modules may be logical or physical modules.

Figure 1B:
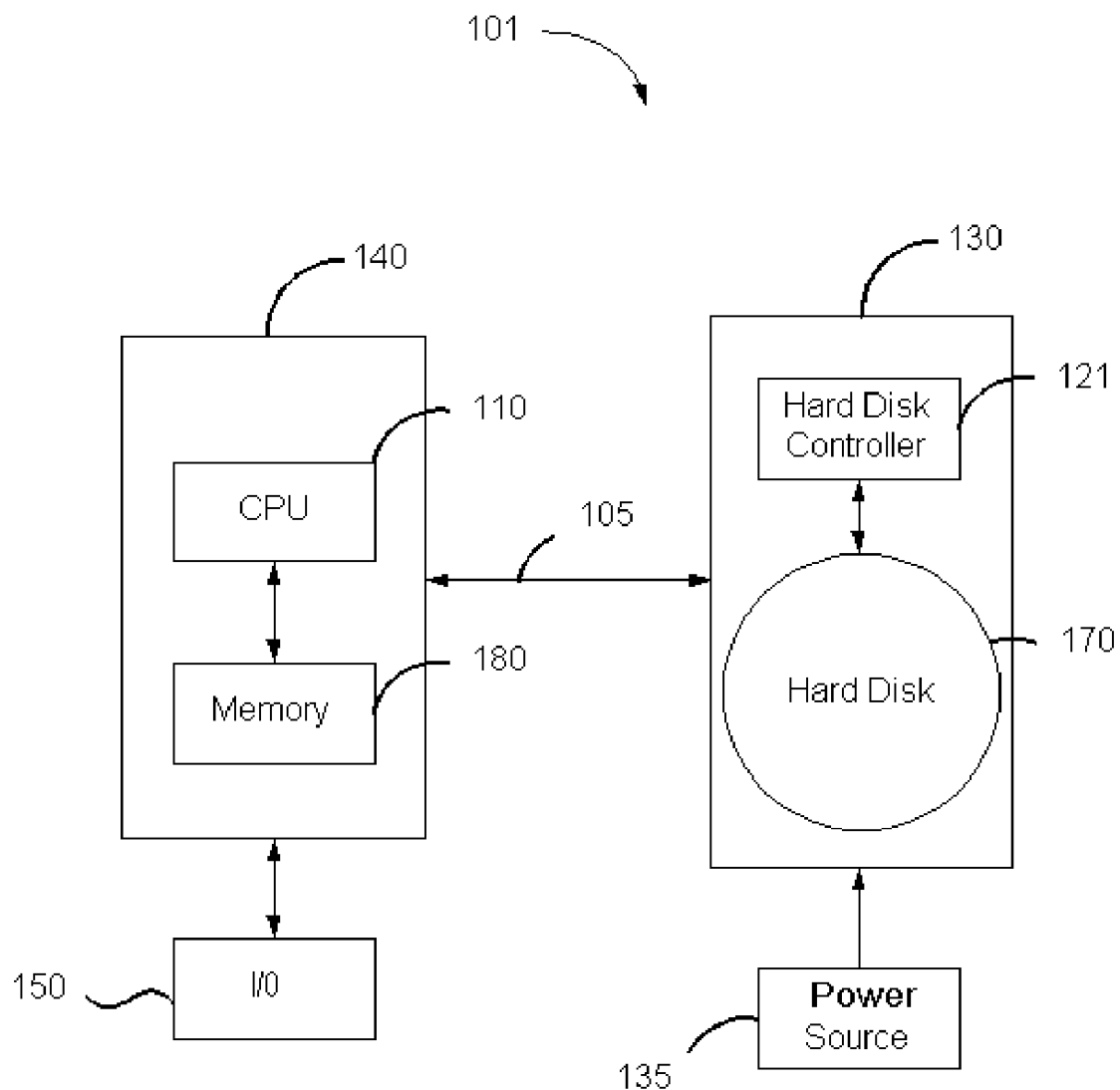
FIG. 1B illustrates a computing system coupled to a hard disk drive.

FIG. 1B illustrates a computing system 101 wherein the recording medium is a hard disk drive 130. The computing system 101 includes the computing device 140 which may communicate with the hard disk drive 130. The computing system 101 and the disk drive 130 may send and receive commands related to data storage using a communication bus 105. The hard disk drive 130 includes a hard disk controller 121 that operates the write and read commands on a hard disk 170.

After a power management message is constructed, it may then be transmitted to the hard disk controller 121. In one embodiment, the hard disk 170 may be a device with multiple magnetic platters for recording data. In another embodiment, the hard disk 170 may be a solid-state device that has a logical memory structure identical to that of a recording medium with multiple magnetic platters. The hard disk controller 121 parses the power management message and identifies the components contained in the power management message such as the set-current command, the drive identifier and the amount of current.

FIG. 2 illustrates a tabular diagram 200 of the content of an exemplary power management message sent to recording medium 130. As mentioned above, the power management message may contain three components: a set-current command, a current amount, and a drive identifier. In one embodiment, prior to sending the power management message to the hard drive controller 121, the message may be stored in memory 180.

After the message is sent, the message may temporarily be stored in, for example, registers (not shown) included in hard disk 170 or elsewhere in medium 130. Once the hard disk controller 121 executes the set-current command, the portions of memory 180 used to store the message may be freed to store other data. A command field 210 contains the set-current command. The drive identifier is stored in a drive field 220. The maximum amount of current is stored in a feature field 230.

The amount of current may be stored as, for example, a number that will be factored with a multiplier constant. The multiplier constant may be stored in the hard disk 170 and readily accessible to the hard disk controller 121. The controller 121 then uses the multiplier constant to calculate the maximum amount of current permitted. For example, if the limit on the amount of current used by the recording medium 130 is to be two amps, and the multiplier constant is 20 milliamps, the value stored in the feature field 230 would be 100. Alternatively, the amount of current may be stored as the magnitude of the actual limit amount of current that the recording medium 130 can handle. For example, if the limit on the amount of current used by the recording medium 130 were to be two amps, the value stored in the feature field 230 would be two. In addition, as an option, if the value stored in the feature field 230 is zero, no current restriction will be imposed on the recording medium 130.

Figure 3:
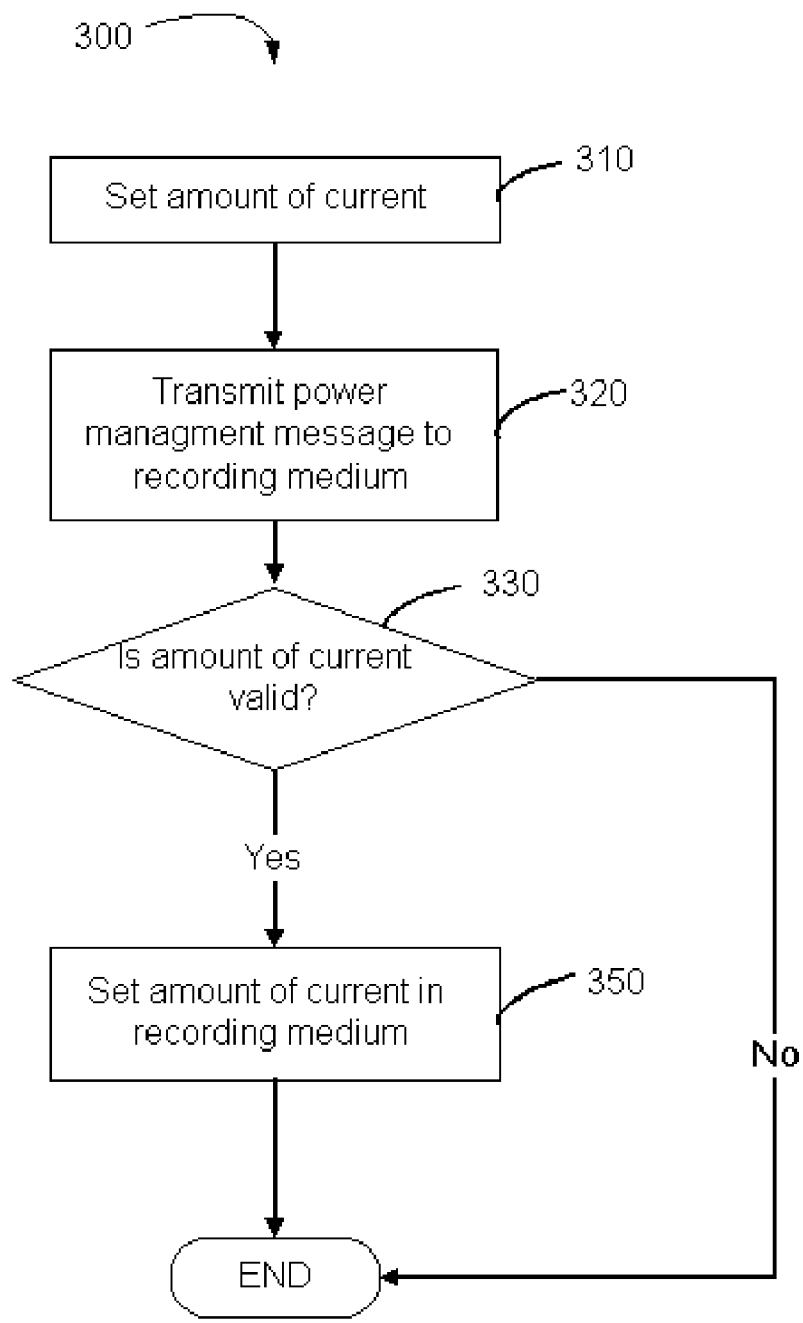
FIG. 3 illustrates a flow diagram for a method of setting a maximum amount of current used by a recording medium.

FIG. 3 illustrates a flow diagram for a method 300 in one approach of setting a maximum amount of current for the recording medium 130. A process 310 sets a value for the amount of current. The value may be set through user input or generated by a computer program running on the computing device 140. Next, during process 320, the drive identifier, the amount of current, and a command are transmitted to the recording medium 130. As mentioned above, these components may be transmitted, for example, to a hard disk drive controller or a flash memory controller.

Subsequently, the amount of current may be checked during decision block 330 to determine whether it is valid. Valid values for the amount of current are, for example, non-negative values and values that are not greater than the maximum current that the power source 135 can provide. In decision block 330, if the amount of current is valid, the amount of current is set by the medium controller 120 during process block 350. Otherwise, the process ends without setting the amount of current to any value. The medium controller 120 may set the amount of current by storing the current amount for future operations. The medium controller 120 may be coupled to a power source connected to the recording medium 130. The medium controller 120 may control the amount of current flowing from the power source to the recording medium 130 every time a new operation is received. Alternatively, the controller 120 may transmit a signal to the power source indicating the maximum amount of current that the power source must produce for any future operation.

As such, for all subsequent operations, the controller 120 will control the consumption of power by limiting the maximum amount of current used. If the subsequent operation is a power management message, however, the amount of current used will be updated, and therefore restricted, to the new value transmitted in the last power management message. In other embodiments, a subsequent storage operation, such as a write operation, may be performed after receiving a write message that includes a maximum current limit. The controller 120 would then perform the write operation using the maximum current limit received with the write message. In one approach, the controller 120 may continue using the maximum amount of current imposed during the write message.

In another embodiment, the consumption of power for subsequent operations may be controlled by using the current in bursts. In other words, the usage and non-usage of current may be time-split such that on average the amount of current used is equal to the maximum current value received by the controller 120. For example, the normal amount of current that the recording medium 130 receives may be 600 mA, and a user may wish to limit the power consumption of the recording medium 130 to 150 mA. The controller 120 could then draw the current amount of 600 mA for one second, and draw a near-zero current amount for the next three seconds. Effectively, during the cumulative four-second period, the current amount used would be 600 mA, and on average, the amount of current used would be 150 mA per second. Thus, the maximum amount of current used on average could be said to be 150 mA. In one approach, this can be achieved by programming the controller 120 to draw current in short bursts. In another approach, this can be achieved by utilizing a capacitor (not shown) to store received current bursts while permitting an even flow of a lower current out of the capacitor.

Once the controller 120 sets the maximum current value, it may then transmit a message to the CPU 110 including a signal indicative of a status of the maximum current value to be consumed by the recording medium 130.

Figure 4:
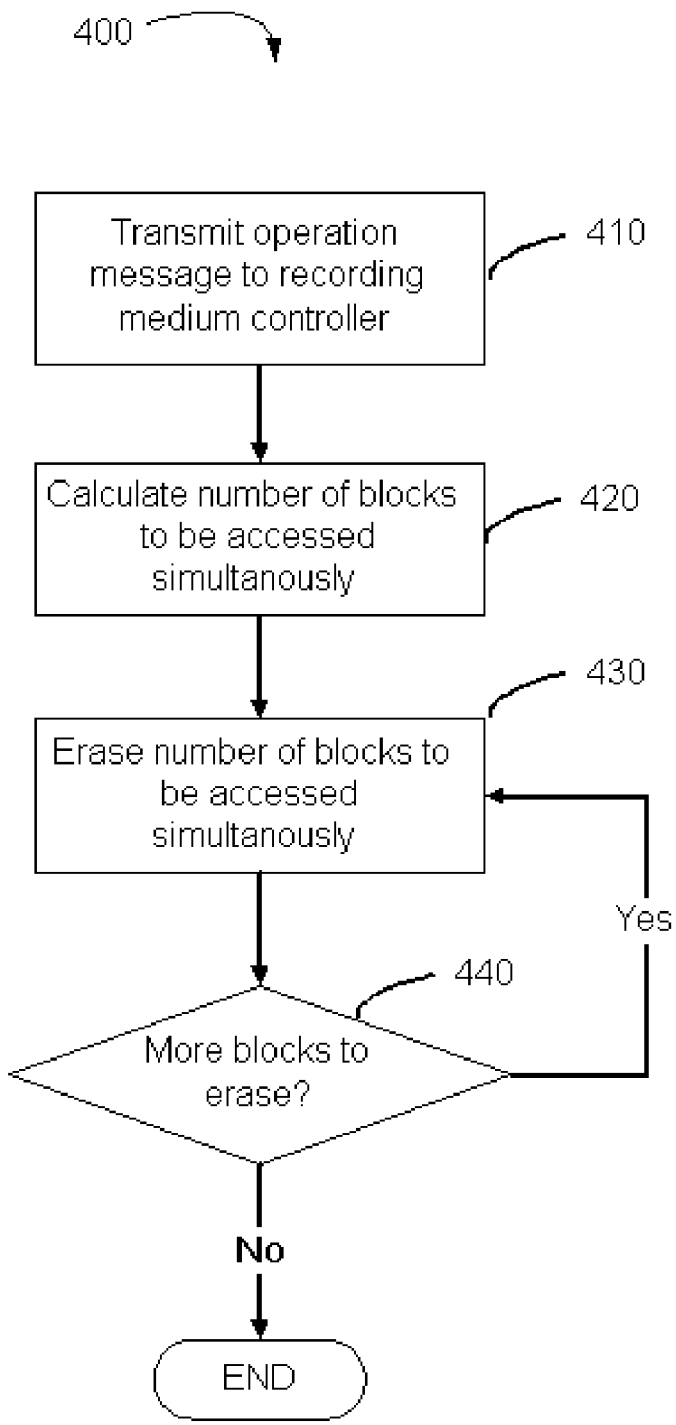
FIG. 4 illustrates a flow diagram for a method of performing an operation that uses a previously set maximum amount of current.

FIG. 4 illustrates a flow diagram for a method 400 of performing an operation to access multiple blocks of data in a recording medium that is limiting its operation to a maximum amount of current, for example, as set by a command received with a maximum amount of current or as may have been previously set in a prior command. The requested operation may be, for example, the erasure of data from a recording medium 130 while limiting operation to no greater than the maximum amount of current. During such an erasure operation, and especially if the erasure operation is a secure erase, multiple blocks of data may be erased simultaneously. In other cases, the operation may be a reading operation, which also may affect multiple blocks of data in the recording medium.

During transmission process block 410, a computing device 140 transmits an operation message to the recording medium controller 120. In process 420, the number of blocks to be simultaneously accessed is calculated by the recording medium controller 120. The number of blocks to be accessed simultaneously may be determined, for example, by dividing a previously set maximum amount of current into the amount of current used to perform an operation on one block, which in turn may be pre-stored or pre-programmed. For instance, the manufacturer of controller 120 (or of recording medium 130) may pre-program the amount of current per block used by recording medium 130 during an operation as just described above by hardwiring it into the recording medium controller 120.

In process block 430, once the number of blocks that can be erased simultaneously has been calculated, the controller 120 may direct the erasure of such number of blocks (or in other cases, an even fewer number of blocks). In decision block 440, the controller 120 determines whether there are more blocks to erase. If there are, in process block 430 the controller 120 may erase a further number of blocks and do so in a way that continues to limit the number of blocks that are erased simultaneously based on the calculation in block 420. In this manner, the limit set for the amount of current to be consumed by recording medium 130 will not be exceeded when performing an erase command. The foregoing method 400 also may apply to other storage operations that may act on multiple blocks of data such as a write operation.

While the above description contains many specifics, these should not be construed as limitations on the scope of the disclosure, but rather as an exemplification of preferred embodiments thereof. For example, although the above discussion for the disclosed embodiments primarily discusses the limit of current to a maximum value, in other embodiment the power usage of the recording medium could be limited to, for example, a maximum value of power. The disclosure includes any combination or subcombination of the elements from the different species and/or embodiments disclosed herein. One skilled in the art will recognize that these features, and thus the scope of this disclosure, should be interpreted in light of the following claims and any equivalents thereto.

What is claimed is:

1. A method for limiting power consumption by a recording medium comprising a plurality of memory blocks, comprising:
    defining a value corresponding to a quantity of current used by the recording medium when performing a storage operation for one of the plurality of memory blocks;
    defining a maximum current limit for operation of the recording medium;
    determining a maximum number of the plurality of memory blocks to operate upon during a single storage operation based on
        (i) the value corresponding to the quantity of current used by the recording medium for one of the plurality of memory blocks and
        (ii) the maximum current limit; and
    limiting operation of the recording medium so that no more than the maximum number of the plurality of memory blocks is operated upon during the single storage operation.

2. The method of claim 1 wherein the maximum current value is received by a controller in the recording medium, the controller configured to control the operations of the recording medium.

3. The method of claim 2 wherein the maximum current value is accompanied by a set-current command when received by the controller.

4. The method of claim 2 wherein the maximum current value is defined by a processor in a computing device, wherein the controller is operable to implement storage operations requested by the processor.

5. The method of claim 4 wherein the processor is coupled to provide commands to the controller corresponding to the single storage operation to be performed by the recording medium.

6. The method of claim 4 further comprising receiving at the processor in the computing device a signal indicative of a status of the maximum current value to be consumed by the recording medium, wherein the signal received from the controller.

7. The method of claim 1 wherein the maximum current value is accompanied by a set-current command.

8. The method of claim 1 wherein the single storage operation is an erase or a write operation.

9. The method of claim 1 wherein the maximum current limit is 150 mA.

10. A method of managing power used by a recording medium, comprising:
    receiving a maximum current value in the recording medium; and
    limiting operation of the recording medium to the maximum current value during a storage operation, wherein if the maximum current value received is zero, current consumption of the recording medium during operation is limited to a default value.

11. The method of claim 10 wherein the recording medium is a non-volatile memory module.

12. The method of claim 10 wherein the receiving of the maximum power value comprises receiving the maximum power value by a controller coupled to control the operation of the recording medium.

13. The method of claim 10 wherein the storage operation is an erase or a write operation.

14. The method of claim 10 wherein the storage operation is performed in a plurality of memory blocks, and the recording medium consumes at most the maximum current value when performing the storage operation on the plurality of memory blocks.

15. The method of claim 10 wherein the recording medium comprises a storage module and a controller coupled to control the storage module, and wherein the receiving of the maximum current value is handled by the controller.

16. The method of claim 15 wherein the maximum current value is received from a processor in a computing device, wherein the recording medium is operable to implement storage operations requested by the processor.

17. The method of claim 16 wherein the processor is coupled to provide commands to the controller corresponding to the storage operation to be performed by the recording medium.

18. The method of claim 16 further comprising transmitting to the processor in the computing device a signal indicative of a status of the maximum current value to be consumed by the recording medium.

19. The method of claim 15 wherein the maximum current value is accompanied by a set-current command when received by the controller.

20. The method of claim 15 wherein the recording medium further comprises a plurality of storage modules controlled by the controller, and wherein the controller further receives a drive identifier which is used to identify a storage module of the plurality of storage modules and wherein storage operations on the storage module are limited to a maximum current value.

21. A method of managing power used by a recording medium, comprising:
   receiving a maximum current value in the recording medium; and
   limiting operation of the recording medium to the maximum current value during a storage operation by calculating a maximum number of memory blocks to operate on simultaneously by dividing the maximum current value into a current value used by one memory block, and performing the storage operation only on the maximum number of memory blocks.

22. The method of claim 21 wherein limiting of the storage operation further comprises limiting current drawn by the recording medium to a value no greater than the maximum current value.

23. The method of claim 21 wherein the recording medium is a non-volatile memory module.

24. The method of claim 21 wherein the receiving of the maximum power value comprises receiving the maximum power value by a controller coupled to control the operation of the recording medium.

25. The method of claim 21 wherein if the maximum current value received is zero, current consumption of the recording medium during operation is limited to a default value.

26. The method of claim 21 wherein the storage operation is an erase or a write operation.

27. A method of managing power consumption by a recording medium, comprising:
   receiving a maximum power value by a recording medium; and
   controlling operation of the recording medium to limit power consumption by the recording medium to a value no greater than the maximum power value, such that power consumption is limited during a plurality of erase operations.

28. The method of claim 27, wherein the recording medium is a non-volatile memory module.

29. The method of claim 27, wherein the receiving of the maximum power value comprises receiving the maximum power value by a controller coupled to control the operation of the recording medium.

30. The method of claim 27, wherein the recording medium comprises a plurality of memory blocks.

31. The method of claim 27, wherein if the maximum current value received is zero, current consumption of the recording medium during operation is limited to a default value.

32. The method of claim 27, wherein limiting of the storage operation further comprises limiting current drawn by the recording medium to a value no greater than the maximum current value.

* * * * *